US010848157B2

(12) United States Patent
Feucht (10) Patent No.: US 10,848,157 B2
(45) Date of Patent: Nov. 24, 2020

(54) LEVEL CONVERTER AND A METHOD FOR CONVERTING LEVEL VALUES IN VEHICLE CONTROL DEVICES

(71) Applicant: KNORR-BREMSE SYSTEME FUER NUTZFAHRZEUGE GMBH, Munich (DE)

(72) Inventor: Thomas Feucht, Wimsheim (DE)

(73) Assignee: KNORR-BREMSE SYSTEME FUER NUTZFAHRZEUGE GMBH, Munich (DE)

( * ) Notice: Subject to any disclaimer, the term of this patent is extended or adjusted under 35 U.S.C. 154(b) by 0 days.

(21) Appl. No.: 16/629,286

(22) PCT Filed: Jun. 12, 2018

(86) PCT No.: PCT/EP2018/065556
§ 371 (c)(1),
(2) Date: Jan. 7, 2020

(87) PCT Pub. No.: WO2019/011556
PCT Pub. Date: Jan. 17, 2019

(65) Prior Publication Data
US 2020/0212913 A1 Jul. 2, 2020

(30) Foreign Application Priority Data
Jul. 11, 2017 (DE) .................. 10 2017 115 511

(51) Int. Cl.
*H03K 19/082* (2006.01)
*H03K 19/0175* (2006.01)
(Continued)

(52) U.S. Cl.
CPC . *H03K 19/0826* (2013.01); *H03K 19/017509* (2013.01); *H03K 19/018521* (2013.01); *H03K 19/09429* (2013.01); *H03K 5/003* (2013.01)

(58) Field of Classification Search
CPC ......... H03K 19/0826; H03K 19/09429; H03K 19/017509; H03K 19/018521; H03K 5/003
(Continued)

(56) References Cited

U.S. PATENT DOCUMENTS 3,845,328 A  10/1974 Hollingsworth
4,023,753 A  5/1977 Dobler
(Continued)

FOREIGN PATENT DOCUMENTS

DE   2363735 A1   8/1975
DE   10120086 A1  11/2001
(Continued)

OTHER PUBLICATIONS

International Search Report dated Oct. 11, 2018, of the corresponding International Application PCT/EP2018/065556 filed Jun. 12, 2018.

*Primary Examiner* — Don P Le
(74) *Attorney, Agent, or Firm* — Norton Rose Fulbright US LLP; Gerard Messina (57) ABSTRACT

A level converter for a vehicle control device, including: a first voltage terminal; a second voltage terminal; at least one output terminal; an input terminal; a first switch for switching a first current path between the first voltage terminal and the at least one output terminal or one of the output terminals; and a second switch for switching a second current path between the second voltage terminal and the at least one output terminal or another of the output terminals; the first and second switches being switchable in response to different levels at the input terminal so that when a first level is present at the input terminal, the first switch is closed and the second switch is open, and so that when a second level is present, the first switch is open and the second switch is
(Continued)

closed. Also described is a related control device, utility vehicle and method.

15 Claims, 4 Drawing Sheets

(51) Int. Cl.
*H03K 19/0185* (2006.01)
*H03K 19/094* (2006.01)
*H03K 5/003* (2006.01)

(58) Field of Classification Search
USPC .................................................. 326/83
See application file for complete search history.

(56) References Cited

U.S. PATENT DOCUMENTS

| | | | | |
|---|---|---|---|---|
| 4,678,943 | A * | 7/1987 | Uragami | H03K 19/09448 326/58 |
| 5,036,222 | A * | 7/1991 | Davis | H03K 19/01721 326/27 |
| 5,138,199 | A * | 8/1992 | Hirata | H03K 19/00307 326/67 |
| 5,633,603 | A * | 5/1997 | Lee | G11C 7/1051 326/113 |
| 5,920,210 | A * | 7/1999 | Kaplinsky | H03K 3/3565 326/21 |
| 5,966,026 | A * | 10/1999 | Partovi | H03K 19/0136 326/27 |
| 6,025,736 | A * | 2/2000 | Vora | H03K 17/6257 326/39 |
| 6,346,829 | B1 * | 2/2002 | Coddington | H03K 19/0027 326/68 |
| 6,815,984 | B1 | 11/2004 | Bowers et al. | |
| 6,975,135 | B1 * | 12/2005 | Bui | H03K 19/01858 326/29 |
| 2001/0035779 | A1 | 11/2001 | Ohno | |
| 2005/0040852 | A1 * | 2/2005 | Mentze | H03K 19/01852 326/81 |
| 2008/0054944 | A1 * | 3/2008 | Kwon | H03K 5/15013 326/83 |
| 2009/0015292 | A1 * | 1/2009 | Nishitani | H03K 19/01852 326/80 |

FOREIGN PATENT DOCUMENTS

| | | |
|---|---|---|
| JP | S57 147330 A | 9/1982 |
| RU | 2604054 C1 | 12/2016 |

* cited by examiner

LEVEL CONVERTER AND A METHOD FOR CONVERTING LEVEL VALUES IN VEHICLE CONTROL DEVICES

FIELD OF THE INVENTION

The present invention relates to a level converter for a vehicle control device and to a method for converting level values in vehicle control devices, and in particular to a tristate level converter (having 3 states) in safety-critical systems.

BACKGROUND INFORMATION

In automotive engineering, and in particular in safety-critical systems, it is often necessary to set level values to a plurality of adjustable levels or states. For example, they are voltage values of 0 V or 5 V or else a high-impedance state. The safety-relevant systems comprise for example: ABS (ABS=antilock braking system), EBS (EBS=electronic braking system), ESP (ESP=electronic stability program) or transmission controllers.

The aforementioned conversion to three states (so-called tristate systems) is used for example to apply three different voltage values to analog signals or to pull the analog signal to a defined level. The switchover to the individual voltage values is triggered by means of signal lines (computer ports) such as, for example, in EBSS.x and EBS7. It is likewise possible to achieve a level conversion with two voltage levels by means of integrated circuits and one computer port or with three voltage levels by means of two computer ports.

However, there is a need for level conversions for three voltage values (tristate) by means of only one signal line. Moreover, costs and also resources are intended to be saved to an increased extent in the case of these level conversions.

At least some of the abovementioned problems of the conventional systems are solved by a level converter as described herein and a method for converting level values as described herein.

SUMMARY OF THE INVENTION

The present invention relates to a level converter for a vehicle control device. The level converter comprises a first voltage terminal, a second voltage terminal, an input terminal and at least one output terminal. Moreover, the level converter comprises a first and a second switch. The first switch is configured for switching a first current path between the first voltage terminal and the at least one output terminal (or one of the output terminals). The second switch is configured for switching a second current path between the second voltage terminal and the at least one output terminal (or another of the output terminals). The first switch and the second switch switch in response to different levels at the input terminal in such a way that: (i) when a first level is present at the input terminal, the first switch is closed and the second switch is open, and (ii) when a second level is present, the first switch is open and the second switch is closed.

In the context of the present invention, a switch connected between two elements should be understood to mean an electrical component which opens or closes a current path between the two elements (e.g. between the first/second voltage terminal and the corresponding output terminal) in response to a control signal. The first switch and the second switch can switch complementarily in response to a change of levels at the input terminal. The switching can be effected in parallel, for example, but it can also be effected in a manner offset in time (sequentially) in the event of the level changing. However, both switches should not be closed simultaneously.

The first switch and the second switch can be configured, however, that both switches are open when a third level is present at the input terminal. Optionally, the third level can lie between the first level and the second level.

A level can be understood to mean, for example, a specific voltage value. It goes without saying, however, that the levels can lie within specific ranges of voltage values, the defined switching state (open or closed) being assumed for arbitrary voltages within the aforementioned ranges. Therefore, the three levels can define three ranges of voltage values at the input terminal for which the desired level values are attained at the output terminal. In the case of a plurality of output terminals, at least one of them is always at high impedance and the corresponding level values are then present at the other output terminal (which is not at high impedance). The desired level values are attained by means of voltage values at the first and second voltage terminals. In particular, the three level values at the input terminal need not correlate with the voltage values at the first and second voltage terminals. By way of example, a LOW (HIGH) level at the input terminal can lead to a HIGH (LOW) level at the output terminal.

In further exemplary embodiments, a drive circuit can be provided, which bring about the switching operations. The switches themselves and also the drive circuit can comprise various components (e.g. one or a plurality of transistors), such that the individual switching operations can be configured in any desired way in principle. Therefore, a LOW (HIGH) level an input terminal can also lead to a LOW (HIGH) level at the output terminal.

The first switch and the second switch can each have a control terminal in order to switch respectively the first switch and the second switch in response to control signals. Optionally, the level converter comprises a drive circuit comprising a reference voltage unit for driving the control terminals of the first switch and of the second switch. The reference voltage unit is configured for example to provide the third level, such that the first switch and the second switch are open in the case of an input terminal switched to be at high impedance. What is achieved by means of the reference voltage unit is that the first switch and the second switch are open if no signal is present at the input terminal (i.e. the input terminal is at high impedance).

Optionally, the drive circuit comprises the following: a third switch connected between the input terminal and the control terminal of the first switch, and a fourth switch connected between the input terminal and the control terminal of the second switch. The third switch can be closed when the first level is present at the input terminal. The fourth switch can be closed when the second level is present at the input terminal. Optionally, the reference voltage unit comprises a voltage divider comprising a third voltage terminal and a fourth voltage terminal in order to supply a reference voltage for attaining the third level.

Optionally, the voltage divider, the first switch and the second switch are operable with the following voltages: a voltage in a range of between 3 V and 5 V can be present at the third voltage terminal, a ground potential can be present at the fourth voltage terminal and at the second voltage terminal, and a voltage of at least 5 V (or 10 V, 12 V, 20 V, 32 V, . . . ) can be present at the first voltage terminal.

The first switch and/or the second switch and/or the third switch and/or the fourth switch are/is or comprise(s) optionally transistors, wherein the transistor of the first switch is complementary to the transistor of the second switch, and the transistor of the third switch is complementary to the transistor of the fourth switch. The transistors can be bipolar transistors or field effect transistors (FET).

Optionally, the level converter comprises a multiplicity of resistors comprising one or more of the following resistors:
- a first resistor between the input terminal (or the third switch) and the control terminal of the first switch,
- a second resistor between the input terminal (or the fourth switch) and the control terminal of the second switch,
- a third resistor between the control terminal of the first switch and the first voltage terminal,
- a fourth resistor between the control terminal of the second switch and the second voltage terminal,
- a fifth resistor between the input terminal and the control terminals of the third switch and/or of the fourth switch,
- a sixth resistor between the third voltage terminal and the control terminal of the third switch, and
- a seventh resistor between the fourth voltage terminal and the control terminal of the fourth switch.

Moreover, the level converter can comprise an eighth resistor between the first switch and the second switch. The level converter can likewise comprise a diode between the first switch and the output terminal, said diode being configured to prevent a current flowing back (i.e. counter to the current that flows when the first switch closes) between the output terminal and the first voltage terminal.

Optionally, the at least one output terminal can comprise two output terminals, i.e. said one output terminal and the other output terminal, wherein the first switch and the second switch are switchable in response to the different levels at the input terminal in such a way that at least one of the output terminals is switched to be at high impedance.

The present invention also relates to a control device of a vehicle, in particular of a utility vehicle, comprising one of the level converters described above. The invention likewise relates to a utility vehicle comprising said control device.

The present invention additionally relates to a method for converting level values in a vehicle control device. The method comprises the following steps:
- switching, by means of a first switch, a first current path between a first voltage terminal and an output terminal or one of the output terminals; and
- switching, by means of a second switch, a second current path between the second voltage terminal and the output terminal or another of the output terminals, wherein the first switch and the second switch are switched in response to different levels at the input terminal in such a way that
- when a first level is present at the input terminal, the first switch is closed and the second switch is open and
- when a second level is present, the first switch is open and the second switch is closed.

The present invention also relates to a use of one of the level converters described above for testing a control device, in particular for ascertaining a short circuit. The different level values make it possible to ascertain short circuits with respect to different potential levels, i.e. whether a short circuit toward ground or toward the operating voltage is present (e.g. by means of current measurements).

Exemplary embodiments afford the following advantages, in particular, in comparison with the prior art:
- Only one signal line (computer PIN) is required to carry out a 3-state level conversion. This results in a saving of computer resources.
- The level converter can use discrete components, with the result that a conversion to arbitrary output voltages is possible.
- In principle, it is possible to carry out the level conversion to arbitrary level values, in particular also to level values that are higher than the input voltage.
- As a result of cyclic driving of the circuit with three input levels, for example LOW (0 V), open (high-impedance) and HIGH (for example 5 V), the level converter can be used for test purposes, wherein the circuits to be tested are driven in a targeted manner with the corresponding voltage levels in order to ascertain at what potential level there is a short circuit.
- No special components are required.
- It is possible to implement for example monitorings of analog signals, output stages or voltage limiting circuits without much outlay.

The exemplary embodiments of the present invention will become better understood from the following detailed description and the accompanying drawings of the various exemplary embodiments, which however should not be understood such that they restrict the disclosure to the specific embodiments, but rather serve merely for explanation and understanding.

DETAILED DESCRIPTION

Figure 1:
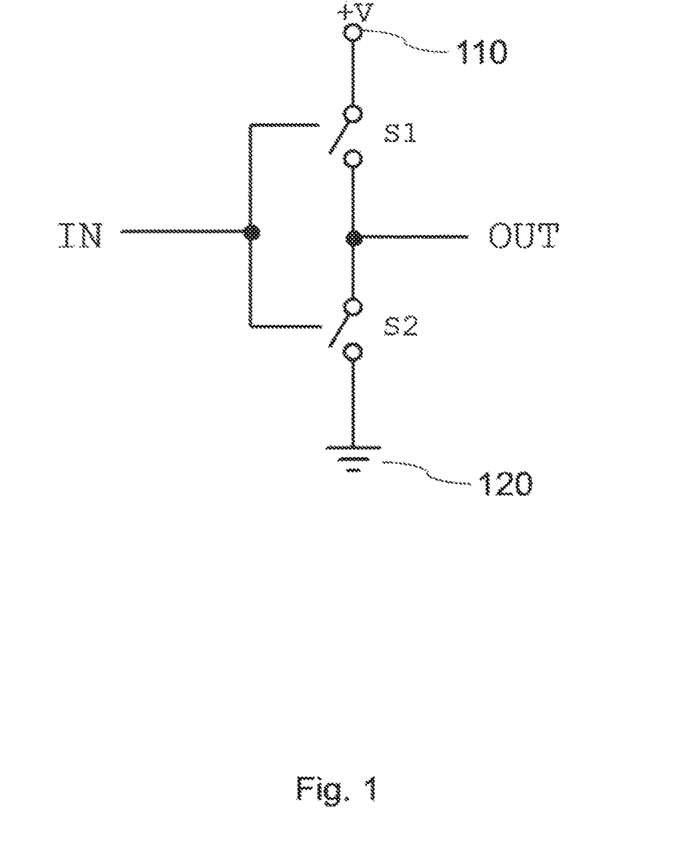
FIG. 1 shows a basic circuit diagram of the level converter in accordance with one exemplary embodiment of the present invention.

FIG. 1 shows a basic circuit diagram of the level converter in accordance with one exemplary embodiment of the present invention. The level converter can be used for example for or in a vehicle control device and comprises: a first voltage terminal 110, a second voltage terminal 120, an output terminal OUT, an input terminal IN, a first switch 110 and a second switch 120. The first switch S1 serves for switching a first current path between the first voltage terminal 110 and the output terminal OUT. The second switch S2 serves for switching a second current path between the second voltage terminal 120 and the output terminal OUT. The first switch S1 and the second switch S2 are switchable in response to different levels at the input terminal IN in such a way that (i) when a first level is present at the input terminal IN, the first switch S1 is closed and the second switch S2 is open, and (ii) when a second level is present, the first switch S1 is open and the second switch S2 is closed.

The first level can be a high voltage, for example, and the second level can be a low voltage, for example. Moreover, the first switch S1 and the second switch S2 can be chosen such that they are open in the case of an intermediate, third level.

The first switch S1 and the second switch S2 furthermore each comprise a control terminal, which couple both to the input terminal IN. For example, the abovementioned levels are present at said control terminals in order to bring about the desired switching operations.

The level converter shown is thus able to implement three states at the output terminal OUT by means of targeted driving of the input terminal IN. The first state results, for example, from the fact that both the first switch S1 and the second switch S2 are open, such that the output terminal OUT is at high impedance (no defined voltage value is present). The second state can be attained, for example, by the first switch S1 being closed, but the second switch S2 remaining open, which is achieved by means of a corresponding level value at the input terminal IN. This second state has the effect that the voltage value +V from the first voltage terminal 110 is present at the output terminal OUT. The third state can be attained by the first switch S1 being opened and the second switch S2 being closed, which has the effect that the level value at the output terminal OUT is set to the voltage present at the second voltage terminal 120 (e.g. ground potential). The voltage V+ at the first voltage terminal 110 can be chosen as desired.

This circuit scheme can be achieved for example by the switches S1, S2 being embodied such that they are complementary to one another, i.e. there is always a level value for which one switch is open and the other switch is closed, but both switches cannot be closed simultaneously. Optionally, however, both switches can be open (for example if no defined voltage value is present at the input terminal IN).

By way of example, the computer port (signal line) mentioned in the introduction can be connected to the input terminal IN, such that the level converter is controllable by means of this one signal line.

Figure 2:
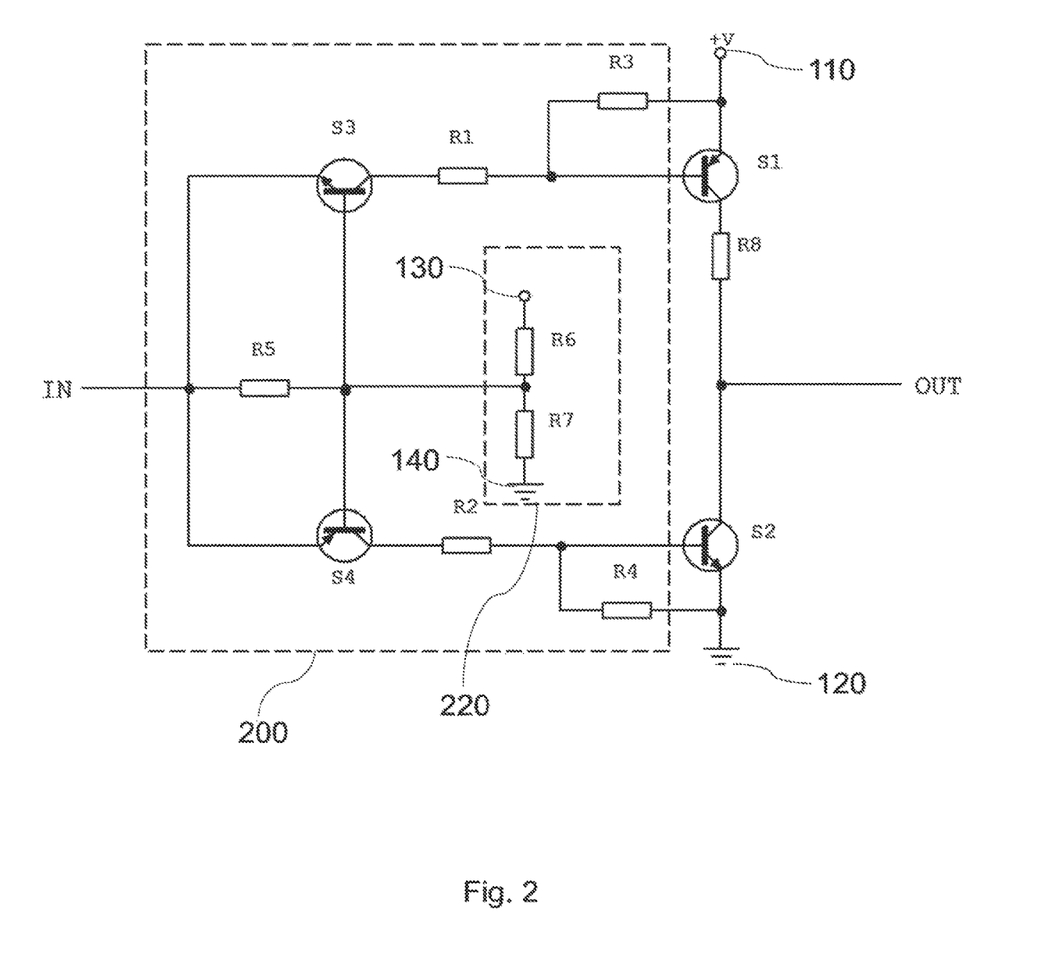
FIG. 2 shows one exemplary embodiment of a concrete implementation by means of complementary transistors as switches.

FIG. 2 shows one possible implementation for the complementary circuit operation mentioned. To that end, the first switch S1 is embodied as a first transistor and the second switch S2 is embodied as a second transistor, which are complementary to one another. Bipolar transistors can be involved, for example, wherein the first transistor S1 is a pnp (or npn) transistor, while the second transistor S2 is correspondingly an npn (or pnp) transistor. The bipolar transistors shown can also be replaced by field effect transistors, of course.

In the exemplary embodiment in FIG. 2, the level converter furthermore comprises a drive circuit 200, which performs the driving of the first switch S1 and of the second switch S2. In this case, the drive circuit 200 comprises an input for the input terminal IN and at least two outputs, of which one couples to the control terminal (base of the bipolar transistor) of the first switch S1 and a second couples to the control terminal (base of the bipolar transistor) of the second switch S2.

Moreover, the drive circuit 200 comprises a third switch S3 and a fourth switch S4. The third switch S3 and the fourth switch S4 each comprise a control terminal, which is electrically connected to the input terminal IN. Moreover, the third switch S3 is connected between the input terminal IN and the control terminal of the first switch S1. The fourth switch S4 is connected in a similar manner between the input terminal IN and the control terminal of the second switch S2.

The drive circuit 200 likewise comprises a reference voltage unit 220, which provides a voltage value for the control terminal of the third switch S3 and for the control terminal of the fourth switch S4, specifically for the case when no defined level value is present at the input terminal IN. The reference voltage unit 220 is a voltage divider, for example, which converts a third voltage value (for example 3.3 V) to a predetermined voltage value chosen such that the third switch S3 and the fourth switch S4 are both open in the case of a high-impedance input terminal IN and the third level value is present at both control terminals of the first and second switches S1, S2, with the result that the first and second switches are opened.

Finally, the level converter from FIG. 2 comprises a total of eight resistors, which can be arranged for example as follows. A first resistor R1 is arranged between the control terminal of the first switch S1 and the third switch S3 (for example at a source or drain terminal of the exemplary transistor). A second resistor R2 is arranged between the control terminal of the second switch S2 and the fourth switch S4 (for example at a source or drain terminal of the exemplary transistor). A third resistor R3 is arranged between the first voltage terminal 110 and the control terminal of the first switch S1. A fourth resistor R4 is connected between the second voltage terminal 120 and the control terminal of the second switch S2. A fifth resistor R5 is connected between the input terminal IN and the control terminals of the third switch S3 and of the fourth switch S4, respectively. A sixth resistor R6 and a seventh resistor R7 are part of the voltage divider in the exemplary reference voltage unit 220 and are connected in series between a third voltage terminal 130 and a fourth voltage terminal 140, wherein current paths to the control terminals of the third switch S3 and of the fourth switch S4 are formed between the sixth resistor R6 and the seventh resistor R7. Optionally, an eighth resistor R8 is arranged between the first switch S1 and the second switch S2 (e.g. between the first switch S1 and the output terminal OUT). The eighth resistor R8 limits the current between the first voltage terminal 110 and the second voltage terminal 120, e.g. in the event of a switchover at the input terminal IN (from LOW to HIGH, or vice versa).

In the embodiment in FIG. 2, all switches, i.e. the first switch S1, the second switch S2, the third switch S3 and the fourth switch S4, are formed by way of example by transistors (bipolar or field effect transistors), wherein not only is the first transistor S1 complementary to the second transistor S2, but also the third transistor S3 is complementary to the fourth transistor S4.

Figure 3:
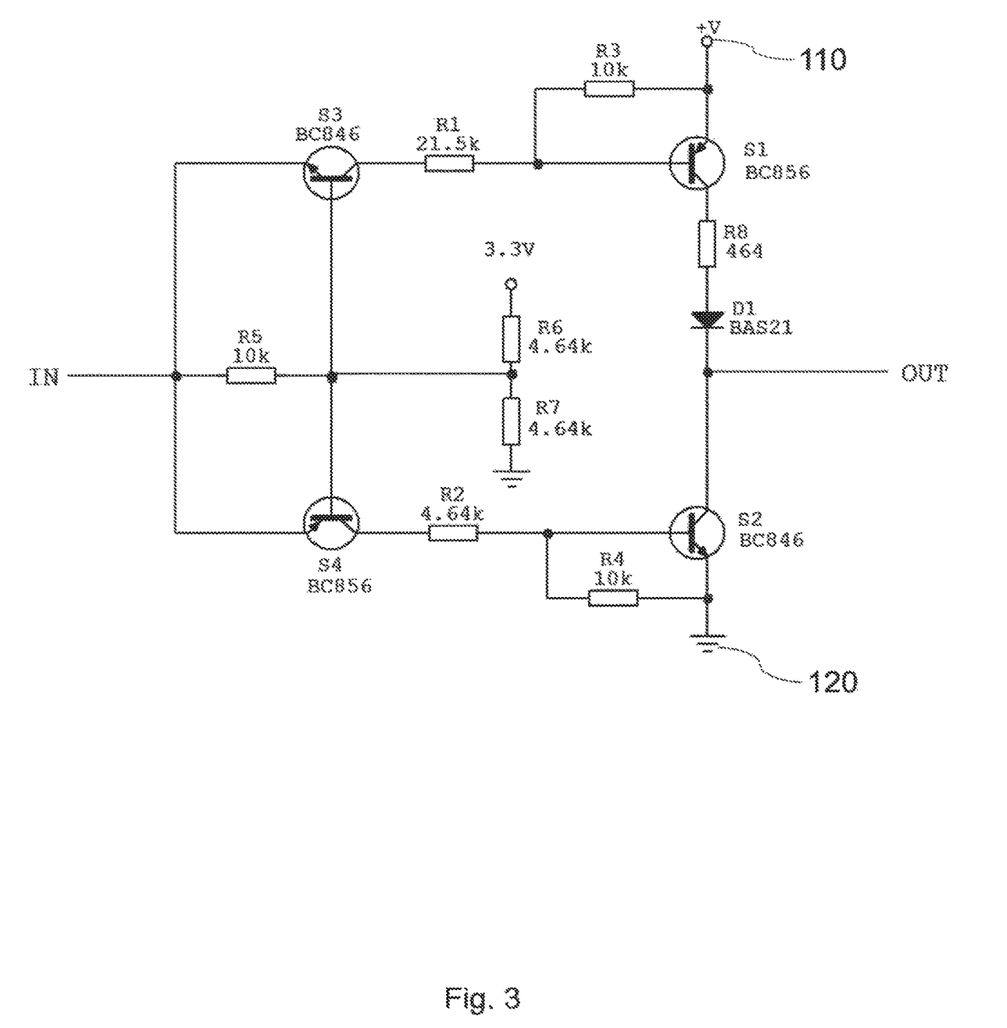
FIG. 3 shows further optional details of the exemplary embodiment from FIG. 2.

FIG. 3 shows a further exemplary embodiment of the level converter, wherein the exemplary embodiment differs merely in that an optional diode D1 is provided between the eighth resistor R8 and the output terminal OUT, said diode preventing a current from being able to flow from the output terminal OUT to the first voltage terminal 110 or being intended at least to limit said current. Otherwise, all further elements are embodied in the same way as in FIG. 2, and so a repeated description is not required.

Figure 4:
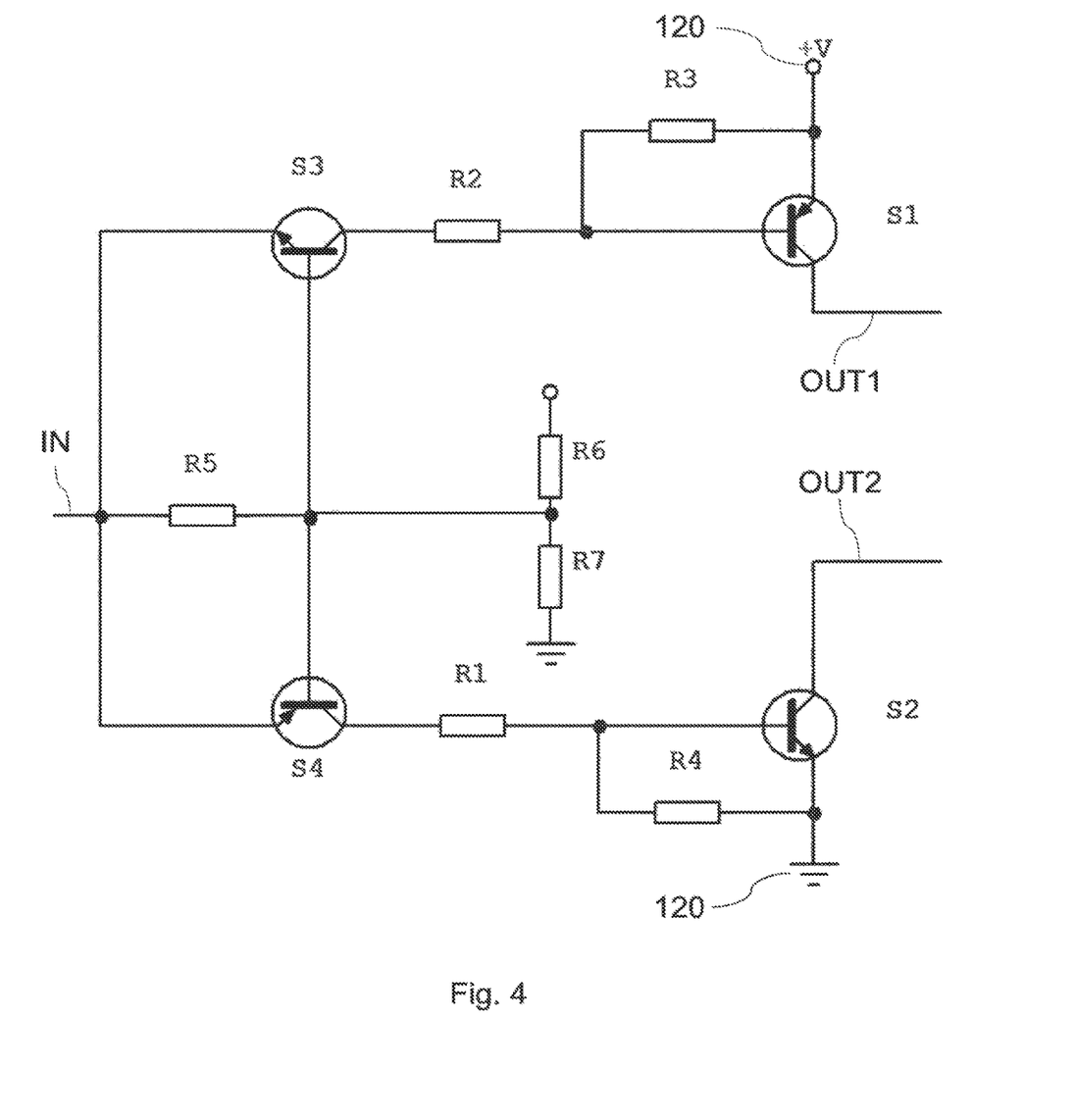
FIG. 4 shows a further exemplary embodiment of a level converter comprising two output terminals.\

FIG. 4 shows a further exemplary embodiment of a level converter comprising two output terminals OUT1, OUT2, wherein the first switch S1 switches the first current path between the first voltage terminal 110 and one of the output terminals OUT1. The second switch S2 switches the second current path between the second voltage terminal 120 and another of the output terminals OUT2. However, the switching operations are once again such that at least one of the output terminals OUT1, OUT2 is always switched to be at high impedance. All further elements are embodied in the same way as in the exemplary embodiments described above. In particular, once again an eighth resistor R8 or a diode D1 can be provided along the first current path and/or along the second current path (e.g. between the first/second switch S1, S2 and the corresponding output OUT1/OUT2). Simple connection of the two output terminals OUT1 and OUT2 gives rise to the configurations described above.

As already stated, a voltage value of approximately 5 V can be present at the first voltage source 110. However, higher voltage values (in principle arbitrary voltage values) can also be present there. In this regard, by way of example, a voltage value of approximately 10 V, 20 V or 32 V can be present there. By way of example, a reference voltage (for example ground) is present at the second voltage terminal 120 and at the fourth voltage terminal 140 and a voltage value of 3.3 V, for example, is present at the third voltage terminal 130. On account of the voltage divider, the voltage value of 3.3 V is divided for example to a voltage value of 1.65 V, which has the effect that if at the input terminal IN is open or a voltage value of approximately 1.65 V is likewise present there, both the third switch S3 and the fourth switch S4 are open and the output terminal OUT is thus at high impedance. Depending on the transistors used for the switches S1, ..., S4, the switching action is effected for specific level values. A first level value can be defined by the fact that a voltage value of from 0 V (ground) to a first upper voltage value (for example 1.2 V) is present at the input terminal. Between the first voltage value and a second voltage value (for example 2 V), the output terminal OUT is at high impedance and, above the second voltage value (for example 2 V), the output terminal OUT is pulled to ground.

The resistors can be chosen for example as follows. The first resistor R1 can have a value of 21.5 kΩ, the second resistor R2 can have a value of 4.64 kΩ, the third, fourth and fifth resistors R3, R4, R5 can have resistance values of 10 kΩ in each case, the sixth and seventh resistors R6, R7 can each have a value of 4.64 kΩ, and the eighth resistor can have a value of 464Ω. These values should be understood to be merely by way of example and can be chosen differently in other exemplary embodiments.

The resistance and voltage values mentioned are understood to be merely by way of example and can be correspondingly adapted to arbitrary other values. In particular, all values mentioned can encompass a tolerance range of ±3% or ±10% or ±50%.

The corresponding ranges in which the three states are assumed by the level converter can be set by means of the resistors depending on the transistors used. By way of example, voltage values of 0 to 3.3 V can be used at the input terminal IN in order to switch the three desired states. As stated, in a voltage range of between 1.2 and 2 V, the third and fourth switches S3, S4 can be open, with the result that the first and second switches S1, S2 are also open and no defined voltage value is present at the output terminal OUT (the state is open). If a voltage value of close to 0 V (ground) or less than 1.2 V is present at the input terminal IN, for example the third switch S3 can close and the fourth switch S4 (since both are complementary to one another) can open, which has the effect that the first switch S1 closes and the second switch opens, such that the voltage value V+ from the first voltage terminal 110 is present at the output terminal OUT. If a voltage value of greater than 2 V or close to 3.3 V is present at the input terminal IN, the third switch S3 opens and the fourth switch S4 is closed, which has the effect that the second switch S2 closes (and the first switch S1 opens), which has the effect that the ground potential from the second voltage source 120 is present at the output terminal OUT.

The functions mentioned can also be summarized as follows:

1. If the input terminal IN is left open, or if the computer port is switched to input, the switches S1 to S4 are not conducting and the output OUT is at high impedance.

2. If the input terminal IN is pulled to ground (or a reference potential GND or LOW), the switches S1 and S3 become conducting and the output OUT is at the first voltage value +V of the first voltage terminal 110 (minus a saturation voltage of the first switch S1 and of the diode D1 possibly present).

3. If the voltage is increased (e.g. to HIGH) at the input terminal IN and becomes greater than the voltage at R6/R7+ 0.8 V, then the switches S2 and S4 become conducting and the output terminal OUT is at the saturation voltage of the second switch S2.

The diode D1 only serves as short-circuit protection if a voltage present at the output terminal OUT is higher than that at the first voltage terminal 110 (i.e. +V). The eighth resistor R8 serves for limiting a shunt current possibly present in the case of switchover between the high-voltage level and the low-voltage level at the input terminal IN.

The features of the invention that are disclosed in the description, the claims and the figures may be essential to the realization of the invention both individually and in any desired combination.

The LIST OF REFERENCE SIGNS is as follows:
110,120, . . . Voltage terminals
S1, S2, . . . Switches
R1, R2, . . . Resistors
D1 Diode
IN Input terminal
OUT, OUT1, . . . One or a plurality of output terminals
200 Drive circuit
220 Reference voltage unit

The invention claimed is:

1. A level converter for a vehicle control device, comprising:
 a first voltage terminal;
 a second voltage terminal;
 at least one output terminal;
 an input terminal;
 a first switch for switching a first current path between the first voltage terminal and the at least one output terminal or one of the output terminals;
 a second switch for switching a second current path between the second voltage terminal and the at least one output terminal or another of the output terminals; and
 a drive circuit;
 wherein the first switch and the second switch are switchable in response to different levels at the input terminal so that when a first level is present at the input terminal, the first switch is closed and the second switch is open, and so that when a second level is present, the first switch is open and the second switch is closed,
 wherein the first switch and the second switch are open when a third level is present at the input terminal,
 wherein the first switch and the second switch each have a control terminal to switch the first switch and the second switch in each case by drive signals, and
 wherein there are a multiplicity of resistors including at least one of: (i) a first resistor between the input terminal and the control terminal of the first switch, (ii) a second resistor between the input terminal and the control terminal of the second switch, (iii) a third resistor between the control terminal of the first switch and the first voltage terminal, (iv) a fourth resistor between the control terminal of the second switch and the second voltage terminal.

2. The level converter of claim 1, wherein the third level lies between the first level and the second level.

3. The level converter of claim 2, wherein the drive circuit includes a reference voltage unit for driving the control terminals of the first switch and of the second switch, wherein the reference voltage unit is configured to provide the third level, such that the first switch and the second switch are open when an input terminal is switched to be at high impedance.

4. The level converter of claim 3, wherein the drive circuit includes a third switch connected between the input terminal and the control terminal of the first switch, and a fourth switch connected between the input terminal and the control terminal of the second switch, and wherein the third switch is closed when the first level is present at the input terminal and the fourth switch is closed when the second level is present at the input terminal.

5. The level converter of claim 3, wherein the reference voltage unit has a voltage divider including a third voltage terminal and a fourth voltage terminal to supply a reference voltage for attaining the third level.

6. The level converter of claim 5, wherein the voltage divider, the first switch and the second switch are operable with the following voltages: a voltage in a range of between 3 V and 5 V at the third voltage terminal, a ground potential at the fourth voltage terminal and at the second voltage terminal, and a voltage of at least 5 V at the first voltage terminal.

7. The level converter of claim 1, wherein the first switch, the second switch, the third switch and the fourth switch include a transistor, and wherein the transistor of the first switch is complementary to the transistor of the second switch and the transistor of the third switch is complementary to the transistor of the fourth switch.

8. The level converter of claim 3, further comprising:
a multiplicity of resistors including at least one of: (v) a fifth resistor between the input terminal and the control terminals of a third switch and of a fourth switch, (vi) a sixth resistor between a third voltage terminal and the control terminal of the third switch, and (vii) a seventh resistor between a fourth voltage terminal and the control terminal of the fourth switch, wherein the sixth resistor and the seventh resistor are connected in series between the third voltage terminal and the fourth voltage terminal.

9. The level converter of claim 8, further comprising:
an eighth resistor along the first current path between the first switch and the second switch.

10. The level converter of claim 1, further comprising:
a diode positioned between the first switch and the at least one output terminal or the one of the output terminals, the diode being configured to prevent a current flowing back between the output terminal and the first voltage terminal.

11. The level converter of claim 1, wherein the at least one output terminal includes the one output terminal and the other output terminal, and wherein the first switch and the second switch are switchable in response to the different levels at the input terminal so that at least one of the output terminals is switched to be at high impedance.

12. A control device of a vehicle, comprising:
a level converter, including:
  a first voltage terminal;
  a second voltage terminal;
  at least one output terminal;
  an input terminal;
  a first switch for switching a first current path between the first voltage terminal and the at least one output terminal or one of the output terminals;
  a second switch for switching a second current path between the second voltage terminal and the at least one output terminal or another of the output terminals; and
a drive circuit;
  wherein the first switch and the second switch are switchable in response to different levels at the input terminal so that when a first level is present at the input terminal, the first switch is closed and the second switch is open, and so that when a second level is present, the first switch is open and the second switch is closed,
  wherein the first switch and the second switch are open when a third level is present at the input terminal,
  wherein the first switch and the second switch each have a control terminal to switch the first switch and the second switch in each case by drive signals, and
  wherein there are a multiplicity of resistors including at least one of: (i) a first resistor between the input terminal and the control terminal of the first switch, (ii) a second resistor between the input terminal and the control terminal of the second switch, (iii) a third resistor between the control terminal of the first switch and the first voltage terminal, (iv) a fourth resistor between the control terminal of the second switch and the second voltage terminal.

13. A utility vehicle, comprising:
a control device of a vehicle, including a level converter;
wherein the level converter includes:
  a first voltage terminal;
  a second voltage terminal;
  at least one output terminal;
  an input terminal;
  a first switch for switching a first current path between the first voltage terminal and the at least one output terminal or one of the output terminals;
  a second switch for switching a second current path between the second voltage terminal and the at least one output terminal or another of the output terminals; and
a drive circuit;
  wherein the first switch and the second switch are switchable in response to different levels at the input terminal so that when a first level is present at the input terminal, the first switch is closed and the second switch is open, and so that when a second level is present, the first switch is open and the second switch is closed,
  wherein the first switch and the second switch are open when a third level is resent at the input terminal,
  wherein the first switch and the second switch each have a control terminal to switch the first switch and the second switch in each case by drive signals, and
  wherein there are a multiplicity of resistors including at least one of: (i) a first resistor between the input terminal and the control terminal of the first switch, (ii) a second resistor between the input terminal and the control terminal of the second switch, (iii) a third resistor between the control terminal of the first switch and the first voltage terminal, (iv) a fourth resistor between the control terminal of the second switch and the second voltage terminal.

14. A method for converting level values, via a level converter, in a vehicle control device, the method comprising:
- switching, by a first switch, a first current path between a first voltage terminal and at least one output terminal or one of the output terminals; and
- switching, by a second switch, a second current path between the second voltage terminal and the at least one output terminal or another of the output terminals;
- wherein the level converter includes a drive circuit,
- wherein the first switch and the second switch are switched in response to different levels at the input terminal so that when a first level is present at the input terminal, the first switch is closed and the second switch is open, and so that when a second level is present, the first switch is open and the second switch is closed,
- wherein the first switch and the second switch are open when a third level is present at the input terminal,
- wherein the first switch and the second switch each have a control terminal to switch the first switch and the second switch in each case by drive signals, and
- wherein there are a multiplicity of resistors including at least one of: (i) a first resistor between the input terminal and the control terminal of the first switch, (ii) a second resistor between the input terminal and the control terminal of the second switch, (iii) a third resistor between the control terminal of the first switch and the first voltage terminal, (iv) a fourth resistor between the control terminal of the second switch and the second voltage terminal.

15. The level converter of claim 1, wherein the level converter is for testing a control device and/or for ascertaining a short circuit.

* * * * *